US008548936B2

(12) United States Patent
Iwamasa

(10) Patent No.: US 8,548,936 B2
(45) Date of Patent: Oct. 1, 2013

(54) PROPERTY EXTRACTION APPARATUS AND METHOD

(75) Inventor: Mikito Iwamasa, Tokyo (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 400 days.

(21) Appl. No.: 12/888,762

(22) Filed: Sep. 23, 2010

(65) Prior Publication Data

US 2011/0071974 A1   Mar. 24, 2011

Related U.S. Application Data

(63) Continuation of application No. PCT/JP2009/055322, filed on Mar. 18, 2009.

(30) Foreign Application Priority Data

Mar. 27, 2008   (JP) .................................. 2008-083431

(51) Int. Cl.
*G06N 5/00*   (2006.01)

(52) U.S. Cl.
USPC .............................................. 706/47; 706/45

(58) Field of Classification Search
USPC ....................................................... 706/47, 45
See application file for complete search history.

(56) References Cited

PUBLICATIONS

Vollbrecht, et al., State Machines for Extensible Authentication Protocol (EAP) Peer and Authenticator, Memo to the Internet Society, 2005, pp. 1-52.*
International Search Report and Written Opinion dated Ma Apr. 14, 2009 from PCT/JP2009/055322.
Kakiuchi, et al., "*IP Interfact Protocol no Model-ka to Kensho Shuho no Teian*", IPSJ Symposium Series, Information Processing Society of Japan, Jul. 22, 2003, vol. 2003, No. 11 (DA Symposium 2003), pp. 43 to 48.
Imai, et al., "*System-level Sekkei ni Okeru Assertion no Gosei Shuho*", IPSJ Symposium Series, Information Processing Society of Japan, Aug. 29, 2007, vol. 2007, No. 7 (DA Symposium 2007), pp. 115 to 120.
Pelanek, et al.; "*Deeper Connections between LTL and Alternating Automata*"; 2005, LNCS 3845, pp. 238-249, Springer.
Vardi, Moshe Y.; "*An Automata-Theoretic Approach to Linear Temporal Logic*"; 1996, LNCS 1043, pp. 238-266, Springer.
Foster, et al.; "Assertion-Based Design"; Second Edition, ISBN 4-621-07449-0; May 19, 2004; 15 pages.

* cited by examiner

*Primary Examiner* — Wilbert L Starks
(74) *Attorney, Agent, or Firm* — Ohlandt, Greeley, Ruggiero & Perle, L.L.P.

(57) ABSTRACT

According to one embodiment, a property extraction apparatus includes a state transition machine conversion unit, storage unit, state transition machine contraction unit, and property conversion unit. The state transition machine conversion unit converts an input property into a state transition machine configured by a plurality of transition functions expressed using a plurality of transition labels. The storage unit stores contraction rules that allow to remove a non-input transition. The state transition machine contraction unit contracts the state transition machine by converting a transition label corresponding to a signal to be ignored into a non-input transition in the state transition machine in accordance with contraction instruction information which represents the signal to be ignored, and rewriting the transition functions by applying the contraction rules that allow to remove the non-input transition. The property conversion unit which converts the state transition machine after the contraction processing into an output property.

8 Claims, 5 Drawing Sheets

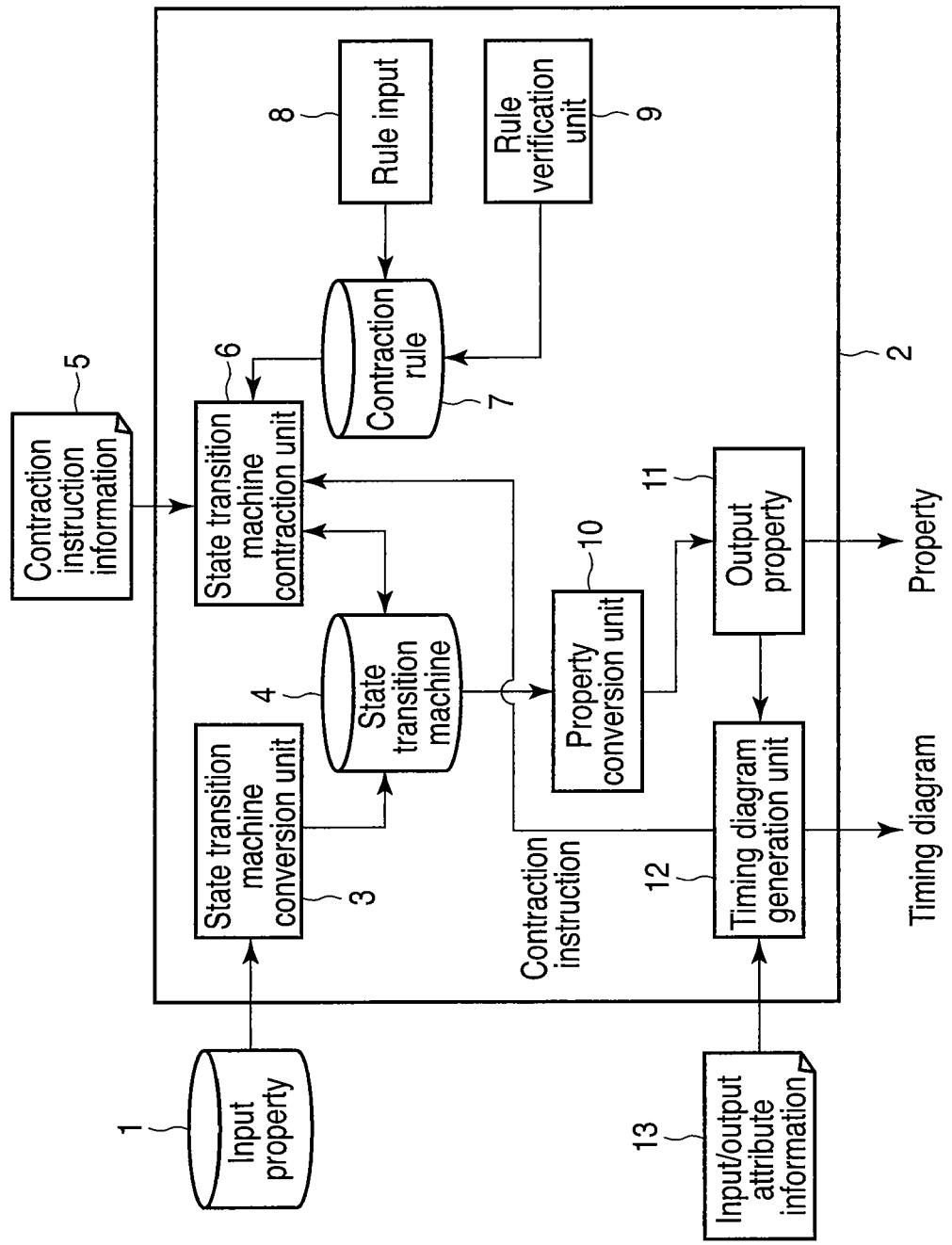
F I G. 1

| State transition pattern | Logical formula |
|---|---|
| | x→Fy |
| | x→X2y |
| | x→yUz |
FIG. 6
| State transition pattern | Logical formula | Timing diagram |
|---|---|---|
| | x→Fy | |
| | x→X2z | |
| | x→yUz | |
Legend of timing diagram 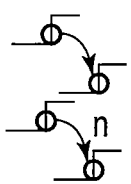 Signal change has order dependence
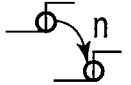 Signal change has temporal dependence
FIG. 7

PROPERTY EXTRACTION APPARATUS AND METHOD

CROSS-REFERENCE TO RELATED APPLICATIONS

This is a Continuation Application of PCT Application No. PCT/JP2009/055322, filed Mar. 18, 2009, which was published under PCT Article 21(2) in Japanese.

This application is based upon and claims the benefit of priority from prior Japanese Patent Application No. 2008-083431, filed Mar. 27, 2008, the entire contents of which are incorporated herein by reference.

FIELD

Embodiments described herein relate generally to a property extraction apparatus and method used in an assertion-based design targeted at, for example, software, hardware such as an LSI, and a system as a combination of software and hardware.

BACKGROUND

As one means for realizing rapid development in an LSI design and embedded software design, an assertion-based design/verification method, which describes restrictions represented by temporal logic (LTL, PSL, etc.) formulas as assertions in a specification, and conducts a design or verification using them has received a lot of attention (for example, see "non-patent reference 1" below). In the assertion-based design, assertions are defined as properties for respective components of a system, these properties attached to components are embedded in a system, and a design is conducted while verifying whether or not properties of components are violated in design processes.

Since a design problem includes processes for creating an entirety by appropriately combining parts, it is required to verify properties which appear only when components are combined (for example, properties across components and those as a completed system as a whole). However, a means for obtaining these properties from individual component properties has never been provided. For this reason, a technique for combining properties and extracting a necessary part is demanded.

On the other hand, in a formal verification theory of software, a verification technique such as model verification using properties described using logic formulas represented by LTL (Linear Temporal Logic) formulas has been studied. For example, in model verification, LTL formulas are temporarily converted into state transition machines (automata), and it is verified whether or not properties described using LTL formulas by combining the state transition machines and a model to be verified (which is also described as a state transition machine) is approved.

Therefore, it is considered to practically implement a technique which combines properties or extracts a necessary part by applying a technique for manipulating state transition machines based on a technique for converting temporal logic formulas into state transition machines.

As for the LTL (Linear Temporal Logic) as one type of temporal logics, a technique for converting the LTL formulas into alternating automata as one type of automata has been established (for example, see "non-patent reference 2" below). Furthermore, a technique for converting alternating automata into linear temporal logic formulas has also been established (for example, see "non-patent reference 3" below).

Non-patent Reference 1: "Assertion-based design" Second Edition, written by Harry D. Forster, Adam C. Krolnik, and David J. Lacey, edited by Teruo Higashino, Kozo Okano, and Akio Nakata, Maruzen Shoten Non-patent Reference 2: "An Automata-Theoretic Approach To Linear Temporal Logic", MY Vardi—Logics for Concurrency: Structure Versus Automata, 1996, Springer-Verlag Inc.

Non-patent Reference 3: "Deeper Connections between LTL and Alternating Automata", Pelanek, R. and Strejcek, J., Proc. of Conference on Implementation and Application of Automata (CIAA 2005)

BRIEF DESCRIPTION OF THE DRAWINGS

FIG. 1 is a block diagram showing a property extraction apparatus according to one embodiment;

FIG. 6 is a table showing examples of patterns and corresponding logic formulas;

FIG. 7 is a table showing correspondence between patterns and timing diagrams.

DETAILED DESCRIPTION

Figure 2:
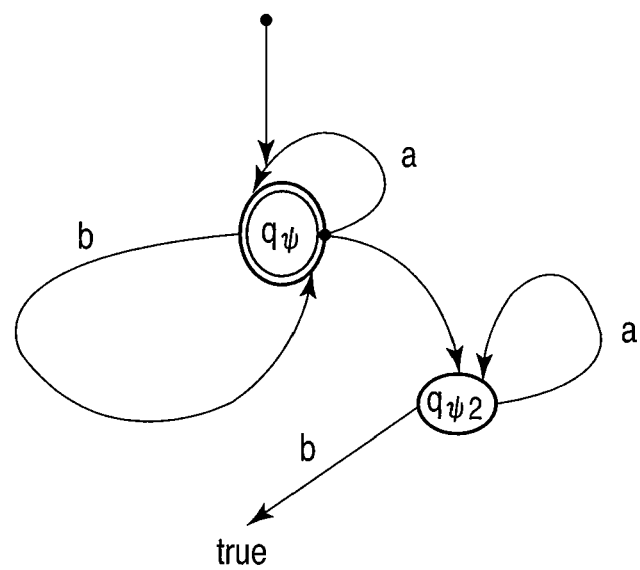
FIG. 2 shows a graph of an alternating automaton.

In general, according to one embodiment, a property extraction apparatus includes a state transition machine conversion unit, storage unit, state transition machine contraction unit, and property conversion unit. The state transition machine conversion unit converts an input property into a state transition machine configured by a plurality of transition functions expressed using a plurality of transition labels. The storage unit stores contraction rules that allow to remove a non-input transition. The state transition machine contraction unit contracts the state transition machine by converting a transition label corresponding to a signal to be ignored into a non-input transition in the state transition machine in accordance with contraction instruction information which represents the signal to be ignored, and rewriting the transition functions by applying the contraction rules that allow to remove the non-input transition. The property conversion unit which converts the state transition machine after the contraction processing into an output property.

FIG. 1 is a block diagram showing a property extraction apparatus according to an embodiment. As shown in FIG. 1, a property extraction apparatus 2 includes a state transition machine conversion unit 3 which converts an input property 1 into a state transition machine 4, a state transition machine contraction unit 6 which contracts the state transition machine 4 by applying a contraction rule 7 according to contraction instruction information 5, a rule input unit 8 which allows to input, add, or delete the contraction rule 7, a rule verification unit 9 which verifies the validity of the contraction rule 7, a property conversion unit 10 which converts the state transition machine 4 after the contraction processing into an output property 11, and a timing diagram generation unit 12 which generates timing diagrams from the output property 11 in accordance with input/output attribute information 13. Note that in the above arrangement, the contraction rule 7 configures a storage means such as a memory or hard disk which stores information representing contraction rules. Also, an arrangement which does not include the rule verification unit 9 and/or the timing diagram generation unit 12 may be adopted. The property extraction apparatus 2 according to this embodiment can be implemented as software which executes information processing using hardware of a general-purpose computer.

An LTL (Linear Temporal Logic) as a representative description method of properties handled by this embodiment will be described first. The LTL is built up from variables p1, p2, . . . , logic operators "¬" (negation), "∨" (OR), "∧" (AND), "→" (implication), and "true" (hold), and "false" (not hold), and modal operators. The modal operators include X (next), G (globally), F (in the future), U (until), and R (release).

Note that the X, G, and F operators are unary operators, and the U and R operators are binary operators. Letting φ and Φ be logic formulas, the modal operators have the following meanings. That is, "Xφ" represents a "φ has to hold at the next state" property, "Gφ" represents a "φ has to hold on the entire subsequent path" property, and "Fφ" represents a "φ eventually has to hold somewhere on the subsequent path" property, "ΦUφ" represents a "Φ has to hold at least until φ, which holds at the current or a future position" property, and "ΦRφ" represents "φ has to be true until and including the point where Φ first becomes true" property.

The modal operators have mutual relations. For example, a certain operator can be replaced by another operator like Fφ=true Uφ, Gφ=¬F¬φ=¬(true U¬φ)=false Rφ, and φR Φ=¬(¬φU¬Φ).

(State Transition Machine Conversion Unit 3)

The definitions of a state transition machine will be explained first. Assume that a state transition machine in this embodiment is, for example, an alternating automaton. An alternating automaton A is configured by a tuple (Σ, Q, q0, δ, F), where Σ is a finite alphabet and true, Q is a set of finite states, q0∈Q is an initial state, true ∈Q is an accepting state, and false ∈Q is a non-accepting state. δ is a transition function, and is defined by δ: Q×Σ→β+(Q). Note that β+(Q) represents a positive Boolean form on a state Q. F⊆Q is an accepting state.

(Property Example)

As an input to the property extraction apparatus 2, for example, the input property 1 like "φ=G(a→Fb)" is supplied. This φ means that "if signal a always has to hold in the future, signal b will hold somewhere". As will be described below, the state transition machine conversion unit 3 converts the input property 1 into an alternating automaton (state transition machine 4). A description of non-patent reference 2 can also be referred to about how to convert a property into an alternating automaton.

(1) Assume a state Q={q_<Φ>, q_<¬Φ>|Φ is a partial formula of φ}. Note that q_Φ> is a state which represents Φ.

(2) Assuming that the transition function δ is a, b∈Σ, it is recursively defined by the following rewriting processes.

(Recursive Definition of Transition Function)

$$\delta(q\_<T>,a)=\text{true}$$

$$\delta(q\_<a>,b)=\text{true} \ldots, \text{when } a=b$$

$$\delta(q\_<a>,b)=\text{false} \ldots, \text{when } a \neq b$$

$$\delta(q\_<\neg\Phi>,a)=\text{dual}(\delta(q\_<\Phi>,a))$$

$$\delta(q\_<\Phi\wedge\rho>,a)=\delta(q\_<\Phi>,a)\wedge\delta(q\_<\rho>,a)$$

$$\delta(q\_<X\Phi>,a)=q\_<\Phi>$$

$$\delta(q\_<\Phi U\rho>,a)=\delta(q\_<\rho>,a)\vee (\delta(q\_<\Phi>,a)\wedge (q\_\Phi U\rho>))$$

where dual(α) is a dual term for a variable α, and is defined as follows.

(Definition of Dual)

$$\text{dual}(\text{true})=\text{false}, \text{dual}(\text{false})=\text{true}$$

$$\text{dual}(q\_<\neg\Phi>)=q\_<\Phi>$$

$$\text{dual}(q\_<\Phi>)=q\_<\neg\Phi>$$

$$\text{dual}(\beta\wedge\gamma)=\text{dual}(\beta)\vee\text{dual}(\gamma)$$

$$\text{dual}(\beta\vee\gamma)=\text{dual}(\beta)\wedge\text{dual}(\gamma)$$

Using the above definitions, for example, $\delta(q\_<\Phi>R\rho, a)$ can be expanded as follows.

$$\begin{aligned}\delta(q\_\langle\phi R\rho\rangle,) &= \delta(q\_\langle\neg(\neg\phi U\neg\rho)\rangle, a)\\ &= \text{dual}(\delta(q\_\langle\neg\phi U\neg\rho\rangle, a))\\ &= \text{dual}(\delta(q\_\langle\neg\rho\rangle, a)\vee(\delta(q\_\langle\neg\phi\rangle, a)\wedge(q\_\langle\neg\phi U\neg\rho>)))\\ &= \text{dual}(\text{dual}(\delta(q\_\langle\rho\rangle, a)))\vee\\ &\quad (\text{dual}(\delta(q\_\langle\phi\rangle, a))\wedge(q\_\langle\neg\phi U\neg\rho\rangle)))\\ &= \delta(q\_\langle\rho\rangle, a)\wedge(\text{dual}(\text{dual}(\delta(q\_\langle\phi\rangle, a))\wedge(q\_\langle\neg\phi U\neg\rho>)))\\ &= \delta(q\_\langle\rho\rangle, a)\wedge(\delta(q\_\langle\phi\rangle, a)\vee(q\_\langle\phi\rangle R\rho))\end{aligned}$$

Example 1

The sequence for converting the input property 1 into an alternating automaton by calculating the transition functions will be described below.

φ=G(a→Fb) as the input property 1 can be replaced by φ=G(a→Fb)=¬F¬(¬a∨(true U b))=¬(true U¬(¬a∨(true U b)))=false R φ1, if φ1=¬a∨(true U b) and φ2=(true U b). Therefore, the transition functions can be calculated as follows.

(Calculation of Transition)

$$\begin{aligned}\delta(\varphi, a) &= \delta(\varphi 1, a)\wedge(\delta(\text{false}, a)\vee\varphi)\\ &= (\delta(\neg a, a)\vee\delta(\varphi 2, a))\wedge(\text{false}\vee\varphi)\\ &= (\delta(\neg a, a)\vee(\delta(b, a)\vee(\delta(\text{true}, a)\wedge\varphi 2))\wedge(\text{false}\vee\varphi)\\ &= (\text{false}\vee(\text{false}\vee(\text{true}\wedge\varphi 2))\wedge(\text{false}\vee\varphi)\\ &= \varphi 2\wedge\varphi\end{aligned}$$

$$\begin{aligned}\delta(\varphi, b) &= (\delta(\neg a, b)\vee(\delta(b, b)\vee(\delta(\text{true}, b)\wedge\varphi 2))\wedge(\text{false}\vee\varphi)\\ &= (\text{true}\vee(\text{true}\vee(\text{true}\wedge\varphi 2))\wedge(\text{false}\vee\varphi)\\ &= \text{true}\wedge\varphi = \varphi\end{aligned}$$

$$\begin{aligned}\delta(\varphi 1, a) &= (\delta(\neg a, a)\vee\delta(\varphi 2, a))\\ &= (\delta(\neg a, a)\vee(\delta(b, a)\vee(\delta(\text{true}, a)\wedge\varphi 2))\\ &= (\text{false}\vee(\text{false}\vee(\text{true}\wedge\varphi 2))\\ &= \varphi 2\end{aligned}$$

$$\begin{aligned}\delta(\varphi 2, a) &= (\delta(b, a)\vee(\delta(\text{true}, a)\wedge\varphi 2)\\ &= (\text{false}\vee(\text{true}\wedge\varphi 2)\\ &= \varphi 2\end{aligned}$$

-continued $$\delta(\varphi 2, b) = (\delta(b, b) \vee (\delta(\text{true}, b) \wedge \varphi 2)$$
$$= (\text{true} \vee (\text{true} \wedge \varphi 2)$$
$$= \text{true}$$

Upon considering that φ1 cannot be reached from an initial state φ, the alternating automaton A=(Σ, q0, δ, F) corresponding to φ is as follows.

Alternating automaton A=(Σ,q0,δ,F)

$\Sigma = \{q\_\{\phi\}, q\_\{\phi 2\}\}$, $q0 = q\_\{\phi\}$ $\delta(q\_\{\phi\}, a) = q\_\{\phi\} \wedge q\_\{\phi 2\}$ $\delta(q\_\{\phi\}, b) = q\_\{\phi\}$ $\delta(q\_\{\phi 2\}, a) = q\_\{\phi 2\}$ $\delta(q\_\{\phi 2\}, b) = \text{true}$ In case of this <Example 1>, FIG. 2 shows the above alternating automaton in the form of a graph. FIG. 2 expresses a transition in which transition destinations are coupled by ANDing ($\wedge$) of a plurality of states by two-branched arrows of a root of a transition from action a from a state=q__{φ2} from a black dot.

Example 2

As in <Example 1> above, a case will be described below wherein φ=G((a→Fb)∧(b→Fc)) as another example of the input property 1 is converted into an alternating automaton by the state transition machine conversion unit 3.
Since we have:

$$G((a \rightarrow Fb) \wedge (b \rightarrow Fc)) = \text{false } R \ ((a \rightarrow Fb) \wedge (b \rightarrow Fc))$$
$$= \text{false } R \ \varphi 1$$
$$= \text{false } R \ (\varphi 2 \wedge \varphi 3)$$

the calculations of the transition functions are as follows.

$$\delta(\varphi, a) = \delta(\varphi 1, a) \wedge (\delta(\text{false}, a) \vee \varphi)$$
$$= (\delta(\varphi 2, a) \wedge \delta(\varphi 3, a)) \wedge (\varphi)$$
$$= \begin{pmatrix} (\delta(\neg a, a) \wedge \delta(\text{true } U \ b, a)) \wedge \\ (\delta(\neg b, a) \vee \delta(\text{true } U \ c, a)) \end{pmatrix} \wedge \varphi$$
$$= ((\delta(\neg a, a) \vee (\delta(b, a) \vee (\delta(\text{true}, a) \wedge (\varphi 2'))) \wedge (\delta(\neg b, a) \vee (\delta(c, a) \vee (\delta(\text{true}, a) \wedge (\varphi 3'))) \wedge \varphi$$
$$= ((\text{false} \vee (\text{false} \vee (\text{true} \wedge (\varphi 2')))) \wedge (\text{true} \vee (\text{false} \vee (\text{true} \wedge (\varphi 3')))) \wedge \varphi$$
$$= (\varphi 2' \wedge \text{true}) \wedge \varphi$$
$$= \varphi 2' \wedge \varphi$$

$$\delta(\varphi, b) = ((\delta(\neg a, b) \vee (\delta(b, b) \vee (\delta(\text{true}, b) \wedge (\varphi 2'))) \wedge (\delta(\neg b, b) \vee (\delta(c, b) \vee (\delta(\text{true}, b) \wedge (\varphi 3'))) \wedge \varphi$$
$$= ((\text{true} \vee (\text{true} \vee (\text{true} \wedge (\varphi 2'))) \wedge (\text{false} \vee (\text{false} \vee (\text{true} \wedge (\varphi 3')))) \wedge \varphi$$
$$= \varphi 3' \wedge \varphi$$

$$\delta(\varphi, c) = ((\delta(\neg a, c) \vee (\delta(b, c) \vee (\delta(\text{true}, c) \wedge (\varphi 2'))) \wedge (\delta(\neg b, c) \vee (\delta(c, c) \vee (\delta(\text{true}, c) \wedge (\varphi 3'))) \wedge \varphi$$
$$= ((\text{true} \vee (\text{false} \vee (\text{true} \wedge (\varphi 2')) \wedge (\text{true} \vee (\text{true} \vee (\text{true} \wedge (\varphi 3')))) \wedge \varphi$$
$$= (\text{true} \wedge \text{true}) \wedge \varphi$$
$$= \varphi$$

$$\delta(\varphi 2', a) = \delta(\text{true } U \ b, a)$$
$$= (\delta(b, a) \vee (\delta(\text{true}, a) \wedge (\varphi 2'))$$
$$= (\text{false} \vee (\text{true} \wedge (\varphi 2'))$$
$$= \varphi 2'$$

$$\delta(\varphi 2', b) = \delta(\text{true } U \ b, b)$$
$$= (\delta(b, b) \vee (\delta(\text{true}, b) \wedge (\varphi 2'))$$
$$= (\text{true} \vee (\text{true} \wedge (\varphi 2'))$$
$$= \text{true}$$

$$\delta(\varphi 2', c) = \delta(\text{true } U \ b, c)$$
$$= (\delta(b, c) \vee (\delta(\text{true}, c) \wedge (\varphi 2'))$$
$$= (\text{false} \vee (\text{true} \wedge (\varphi 2'))$$
$$= \varphi 2'$$

$$\delta(\varphi 3', a) = \delta(\text{true } U \ c, a)$$
$$= (\delta(c, a) \vee (\delta(\text{true}, a) \wedge (\varphi 3'))$$
$$= (\text{false} \vee (\text{true} \wedge (\varphi 3'))$$
$$= \varphi 3'$$

$$\delta(\varphi 3', b) = \delta(\text{true } U \ c, b)$$
$$= (\delta(c, b) \vee (\delta(\text{true}, b) \wedge (\varphi 3'))$$
$$= (\text{false} \vee (\text{true} \wedge (\varphi 3'))$$
$$= \varphi 3'$$

$$\delta(\varphi 3', c) = \delta(\text{true } U \ c, c)$$
$$= (\delta(c, c) \vee (\delta(\text{true}, c) \wedge (\varphi 3'))$$
$$= (\text{true} \vee (\text{true} \wedge (\varphi 3'))$$
$$= \text{true}$$

An alternating automaton A=(Σ, q0, δ, F) corresponding to φ is as follows.

Alternating automaton A=(Z,q0,δ,F)

Figure 3:
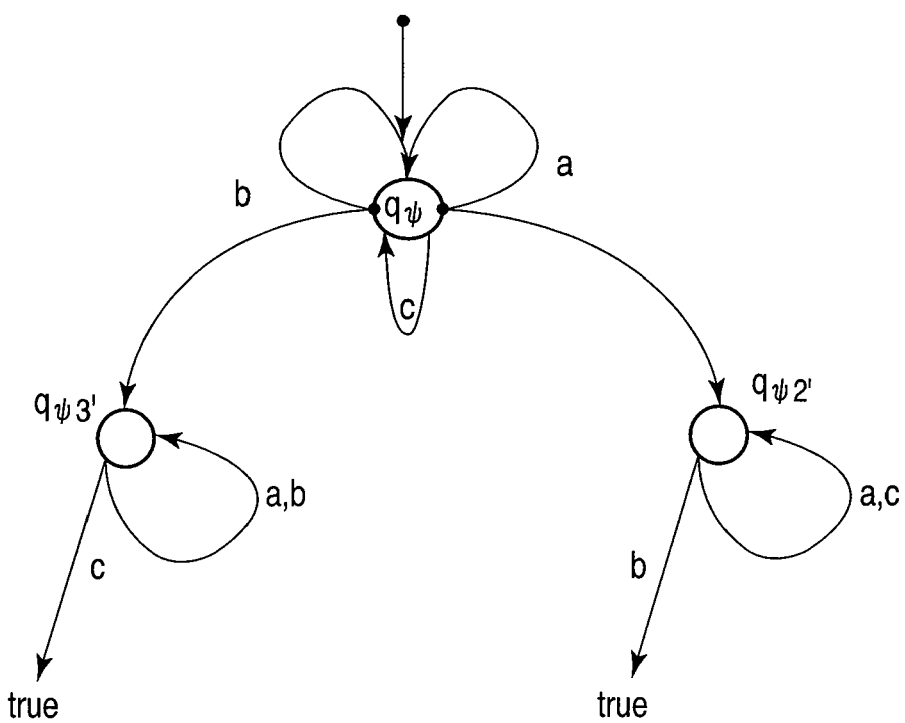
FIG. 3 shows a graph of an alternating automaton.

$\Sigma = \{q\_\{\phi\}, q\_\{\phi 2'\}, q\_\{\phi 2'\}\}$ $q0 = q\_\{\phi\}$ $\delta(q\_\{\phi\}, a) = q\_\{\phi\} \wedge q\_\{\phi 2'\}$ $\delta(q\_\{\phi\}, b) = q\_\{\phi\} \wedge q\_\{\phi 3'\}$ $\delta(q\_\{\phi\}, c) = q\_\{\phi\}$ $\delta(q\_\{\phi 2'\}, a) = q\_\{\phi 2'\}$ $\delta(q\_\{\phi 2'\}, b) = \text{true}$ $\delta(q\_\{\phi 2'\}, c) = q\_\{\phi 2'\}$ $\delta(q\_\{\phi 3'\}, a) = q\_\{\phi 3'\}$ $\delta(q\_\{\phi 3'\}, b) = q\_\{\phi 3'\}$ $\delta(q\_\{\phi 3'\}, c) = \text{true}$ FIG. 3 shows the above alternating automaton in the form of a graph in case of this <Example 2>.

(State Transition Machine Contraction Unit 6>

Assume that a contraction instruction {a, c}, i.e., "focus only on signals a and c", is set as the contraction instruction information 5 with respect to a property $\phi=G((a\rightarrow Fb) \wedge (b\rightarrow Fc))$. This instruction is to ignore a signal b. Ignoring a signal is to convert all transition labels associated with the signal to be ignored into non-input transitions (to be described as "$\epsilon$" hereinafter) in an automaton. In this example, the state transition machine contraction unit 6 converts all labels of the signal b in the alternating automaton (state transition machine 4) into $\epsilon$ as follows.

$\Sigma=\{q\_\{\phi\}, q\_\{\phi 2'\}, q\_\{\phi 2'\}\}$ $q0=q\_\{\phi\}$ $\delta(q\_\{\phi\}, a)=q\_\{\phi\} \wedge q\_\{\phi 2'\}$ $\delta(q\_\{\phi\}, \epsilon)=q\_\{\phi\} \wedge q\_\{\phi 3'\}$ $\delta(q\_\{\phi\}, c)=q\_\{\phi\}$ $\delta(q\_\{\phi 2'\}, a)=q\_\{\phi 2'\}$ $\delta(q\_\{\phi 2'\}, \epsilon)=\text{true}$ $\delta(q\_\{\phi 2'\}, c)=q\_\{\phi 2'\}$ $\delta(q\_\{\phi 3'\}, a)=q\_\{\phi 3'\}$ $\delta(q\_\{\phi 3'\}, c)=q\_\{\phi 3'\}$ $\delta(q\_\{\phi 3'\}, c)=\text{true}$ $F=\{\phi\}$ (Application of Contraction Rules)

Figure 4:
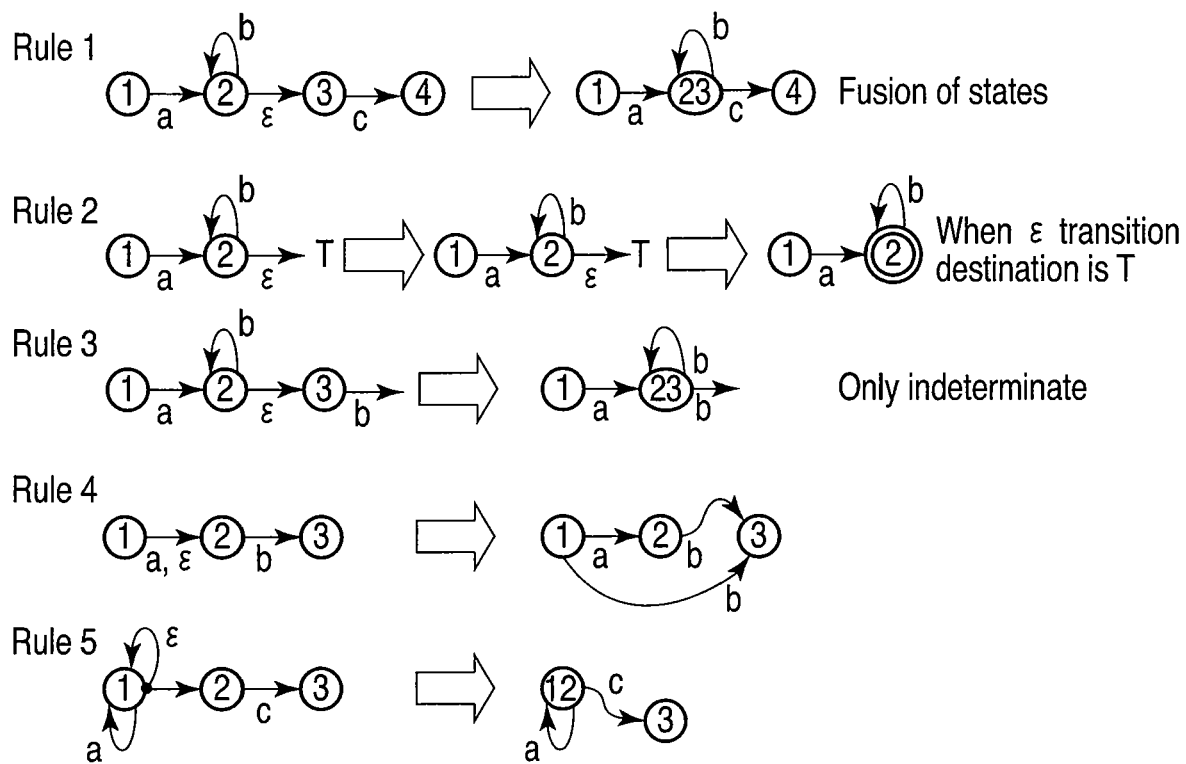
FIG. 4 shows a list of contraction rules.

"Contraction" corresponds to deletion of $\epsilon$ transitions in an automaton without changing an accepting language. "Contraction rules" in this embodiment will be exemplified below. "Contraction" is realized by partially rewriting the transition functions, and the contraction rule 7 stores such rules described as rewriting rules. The contraction rules stored in the contraction rule 7 will be exemplified below. FIG. 4 shows, by means of a graph, how to contract the transition functions by the respective contraction rules.

<Contraction Rule 1>
[Transition Functions Before Contraction]

$\{\delta(q\_1,a)=q\_2$ $\delta(q\_2,b)=q\_2$ $\delta(q\_2,\epsilon)=q\_3$ $\delta(q\_3,c)=q\_4\}$

[Transition Functions after Contraction]

$\{\delta(q\_1,a)=q\_23$ $\delta(q\_23,b)=q\_23$ $\delta(q\_23,c)=q\_4\}$

<Contraction Rule 2>
[Transition Functions Before Contraction]

$\{\delta(q\_1,a)=q\_2$ $\delta(q\_2,b)=q\_2$ $\delta(q\_2,\epsilon)=\text{true}\}$ $F=F0$

[Transition Functions after Contraction]

$\{\delta(q\_1,a)=q\_2T$ $\delta(q\_2T,b)=q\_2T\}$ $F=F0 \cup \{q\_2T\}$

<Contraction Rule 3>
[Transition Functions Before Contraction]

$\{\delta(q\_1,a)=q\_2$ $\delta(q\_2,b)=q\_2$ $\delta(q\_2,\epsilon)=q\_3$ $\delta(q\_3,b)=q\_4\}$

[Transition Functions after Contraction]

$\{\delta(q\_1,a)=q\_23$ $\delta(q\_23,b)=q\_23$ $\delta(q\_23,b)=q\_4\}$

<Contraction Rule 4>
[Transition Functions Before Contraction]

$\{\delta(q\_1,a)=q\_2$ $\delta(q\_1,\epsilon)=q\_2$ $\delta(q\_2,b)=q\_3\}$

[Transition Functions after Contraction]

$\{\delta(q\_1,a)=q\_2$ $\delta(q\_2,b)=q\_3$ $\delta(q\_1,b)=q\_3\}$

<Contraction Rule 5>
[Transition Functions Before Contraction]

$\{\delta(q\_1,a)=q\_1$ $\delta(q\_1,\epsilon)=q\_1 \wedge q\_2$ $\delta(q\_2,b)=q\_3\}$

[Transition Functions after Contraction]

$\{\delta(q\_12,a)=q\_12$ $\delta(q\_12,b)=q\_3\}$

The state transition machine contraction unit 6 rewrites the transition functions by applying the aforementioned contraction rules to the alternating automaton (state transition machine 4) as needed. Practical contraction procedures are as follows.

[Procedure 1]: The contraction rule 7 is searched for an applicable contraction rule.

[Procedure 1a]: If an applicable contraction rule is found in Procedure 1, the control shifts to Procedure 2.

[Procedure 1b]: If an applicable contraction rule is found in Procedure 1, the control shifts to Procedure 4.

[Procedure 2]: The transition functions are rewritten by applying the contraction rule found in Procedure 1. Thus, $\epsilon$ transitions are removed.

[Procedure 3]: Procedure 1 and subsequent procedures are repeated.

[Procedure 4]: If no ε transition remains in the alternating automaton, the control terminates normally; otherwise, it terminates abnormally.

Initially, when <Contraction Rule 4> is applied to transition function parts associated with φ3' in:

$$\delta(q\_\{\phi3'\},a)=q\_\{\phi3'\}$$

$$\delta(q\_\{\phi3'\},\epsilon)=q\_\{\phi3'\}$$

$$\delta(q\_\{\phi3'\},c)=\text{true}$$

these formulas are rewritten to those which do not include any ε transitions, as described by:

$$\delta(q\_\{\phi3'\},a)=q\_\{\phi3'\}$$

$$\delta(q\_\{\phi3'\},c)=\text{true}$$

When <Contraction Rule 2> is applied to transition function parts associated with φ2' in:

$$\delta(q\_\{\phi2'\},a)=q\_\{\phi2'\}$$

$$\delta(q\_\{\phi2'\},\epsilon)=\text{true}$$

$$\delta(q\_\{\phi2'\},c)=q\_\{\phi2'\}$$

these formulas are rewritten to those which do not include any ε transitions, as described by:

$$\delta(q\_\{\phi2'T\}1,a)=q\_\{\phi2'T\}$$

$$\delta(q\_\{\phi2'T\},c)=q\_\{\phi2'T\}$$

$$F=F0\cup\{\phi2'T\}$$

The contraction result of the alternating automaton so far is as follows.

$$\Sigma=\{q\_\{\phi\},q\_\{\phi2'T\},q\_\{\phi3'\}\}$$

$$q0=q\_\{\phi\}$$

$$\delta(q\_\{\phi\},a)=q\_\{\phi\}\wedge q\_\{\phi2'T\}$$

$$\delta(q\_\{\phi\},\epsilon)=q\_\{\phi\}\wedge q\_\{\phi3'\}$$

$$\delta(q\_\{\phi\mathit{l}\},c)=q\_\{\phi\}$$

$$\delta(q\_\{\phi2'T\},a)=q\_\{\phi2'T\}$$

$$\delta(q\_\{\phi2'T\},c)=q\_\{\phi2'T\}$$

$$\delta(q\_\{\phi3'\},a)=q\_\{\phi3'\}$$

$$\delta(q\_\{\phi3'\},c)=\text{true}$$

Furthermore, <Contraction Rule 3> can be applied to the transition functions associated with φ:

$$\delta(q\_\{\phi\},a)=q\_\{\phi\}\wedge q\_\{\phi2'T\}$$

$$\delta(q\_\{\phi\},\epsilon)=q\_\{\phi\}\wedge q\_\{\phi3'\}$$

$$\delta(q\_\{\phi\mathit{l}\})=q\_\{\phi\}$$

$$\delta(q\_\{\phi3'\},a)=q\_\{\phi3'\}$$

$$\delta(q\_\{\phi3'\},c)=\text{true}$$

φ and φ3' are fused together to one state=φ4 by applying <Contraction Rule 5> to obtain:

$$\delta(q\_\{\phi4\},a)=q\_\{\phi4\}\wedge q\_\{\phi2'T\}$$

$$\delta(q\_\{\phi4\mathit{l}\},c)=q\_\{\phi4\}$$

$$\delta(q\_\{\phi4\},a)=q\_\{\phi4\}$$

$$\delta(q\_\{\phi4\},c)=\text{true}$$

Finally, the automaton in which ε transitions are removed is as follows.

(Alternating Automaton after Contraction)

$$\Sigma=\{q\_\{\phi4\},q\_\{\phi2'T\}\}$$

$$q0=q\_\{\phi4\}$$

$$\delta(q\_\{\phi2'T\},a)=q\_\{\phi2'T\}$$

$$\delta(q\_\{\phi2'T\},c)=q\_\{\phi2'T\}$$

$$\delta(q\_\{\phi4\},a)=q\_\{\phi4\}\wedge q\_\{\phi2'T\}$$

$$\delta(q\_\{\phi4\mathit{l}\},c)=q\_\{\phi4\}$$

$$\delta(q\_\{\phi4\},a)=q\_\{\phi4\}$$

$$\delta(q\_\{\phi4\},c)=\text{true}$$

$$F=\{\phi2'T\}$$

Figure 5:
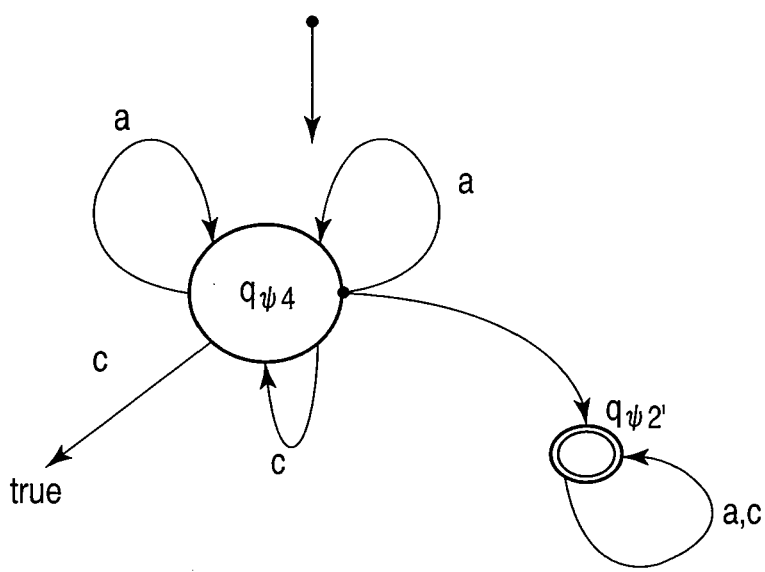
FIG. 5 shows a graph of an alternating automaton.

FIG. 5 shows the above alternating automaton in the form of a graph.

(Property Conversion Unit 10)

The property conversion unit 10 converts the alternating automaton (state transition machine 4) processed by the state transition machine contraction unit 6 into the output property 11 including linear temporal logic formulas having an equal accepting language. A method of expanding a property expressed by an automaton into logic formulas will be described below according to the sequence described in non-patent reference 3. This method can convert logic formulas for respective state variables of the automaton. Logic formulas for an initial state correspond to those of the overall automaton.

Initially, a logic formula for a state variable p in the automaton A:

$$\phi\_\{p\}=\phi1U\phi2$$

is calculated.

Note that φ_{n} represents a logic formula corresponding to a state=n.

φ1 is an OR for transitions of a partial formula associated with transitions including a self loop, i.e., $(a\wedge X\phi\_\{q\})$. Note that φ_{q} is a logic formula corresponding to a state of a transition destination other than a self transition of a label a.

φ_2 is an OR for transitions of a partial formula associated with transitions without including any self loop, i.e., $(b\wedge X\phi\_\{r\})$. Note that φ_{r} is a logic formula corresponding to a state of a transition destination of a label b.

In the example of the alternating automaton after the contraction, we have:

$$\phi\_\{q0\}=((a\wedge X\phi\_\{q1\})\vee a\vee c)U(c)$$

$$\phi\_\{q1\}=(a\vee c)$$

That is, $$\phi\_\{q0\}=((a\wedge X(a\vee c))\vee a\vee c)U(c)$$

(Rule Verification Unit 9)

The rule verification unit 9 verifies the validity of rewriting the transition functions before contraction into those after contraction by applying the contraction rule 7. Initially, the rule verification unit 9 modifies the transition functions into simultaneous equations. Next, the rule verification unit 9 makes arithmetic operations such as substitution and rewriting for the simultaneous equations, and checks if the equations before contraction can be modified into those after contraction, thereby determining the presence/absence of the validity. This processing will be practically explained below taking Contraction Rule 4 as an example.

As described above, <Contraction Rule 4> rewrites [Transition Functions Before Contraction] as:

$$\{\delta(q\_1,a)=q\_2$$

$$\delta(q\_1,\epsilon)=q\_2$$

$$\delta(q\_2,b)=q\_3\}$$

and [Transition Functions After Contraction] as:

$$\{\delta(q\_1,a)=q\_2$$

$$\delta(q\_2,b)=q\_3$$

$$\delta(q\_1,b)=q\_3\}$$

The rule verification by the rule verification unit 9 is done according to the following procedures.

[Procedure 1]: The state function definition is converted into equation forms.

[Procedure 2]: Equations having identical recursive variables in their left-hand sides are combined into one.

[Procedure 3]: The (simultaneous) equations are solved.

[Procedure 4]: Procedures 1 to 3 are executed for the transition functions before and after contraction.

[Procedure 5]: If the results of Procedure 4 assume the same value, it is determined that the contraction rule is correct.

Assume that "(simultaneous) equations" in this embodiment is:

a set of equations, each of which is configured by a recursive variable (V_i: is i is a natural number equal to or smaller than n), a label symbol (a, b, . . . , etc.), a symbol (.) required to use the label symbol as a coefficient of the recursive variable, an operator (|) between label symbols, an operator (|) between recursive variables, and an operator which expresses a time evolution of the recursive variable (=), and is expressed by a form V_i=Σj≤n[label or (|) calculated label].V_j.

Examples of the "(simultaneous) equations" are as follows. X, Y, and Z are recursive variables, and a, b, c, and true are label symbols.

$$X=a.Y+c.X$$

$$Y=b.Z$$

$$Z=true.Z$$

The recursive variables in the equations correspond to state variables. The equations correspond to state transition functions. For example, the following equation using the recursive variables (X, Y) and labels (a, c), i.e., X=a.Y+c.X corresponds to a transition function including two rows:

δ(a state variable corresponding to X, a)=a state variable corresponding to Y

δ(a state variable corresponding to X, c)=a state variable corresponding to X

An AND branch example δ(q_x, a)=q_y∧q_z as a feature of an alternating automaton is expressed by X=a.(Y|Z). (Y|Z) is a combined state in which states Y and Z simultaneously hold.

Labels which are coupled by the (|) operation included in the equation coefficient represent that these labels simultaneously hold. For example, an equation X=(a|b).Y corresponds to a transition function which transits to Y when a and b hold simultaneously, i.e., a "state variable corresponding to δ(a state variable corresponding to X, a&b)=Y".

[Procedure 1] to [Procedure 5] will be respectively described in detail below.

[Procedure 1] will be described below. As described above, in [Procedure 1], the state function definition is converted into equations. This procedure includes [Procedure 1-1] and [Procedure 1-2] below.

[Procedure 1-1]: State variables are replaced by recursive variables on equations. For example, state variables q_1, q_2, and q_3 are respectively replaced by recursive variables X, Y, and Z.

[Procedure 1-2]: The transition function definitions are converted into equations. More specifically, one row of the transition function definitions, i.e., "δ(state variable 1, label)= state variable 2" is converted into an equation having a form "recursive variable 1=label.state variable 2". At this time, an ε transition is converted into a symbol τ.

For example, the transition functions before contraction of <Contraction Rule 4> are converted into equations:

$$X=a.X$$

$$X=\tau.Y$$

$$Y=b.Z$$

[Procedure 2] will be described below. As described above, in [Procedure 2], equations having identical recursive variables in their left-hand sides are combined into one. This procedure includes [Procedure 2-1] and [Procedure 2-2] below.

[Procedure 2-1]: Equations having identical variables in their left-hand sides are collected.

[Procedure 2-2]: The right-hand sides of the collected equations are coupled by operators (+).

In this way, by collecting equations having identical variables in their left-hand sides and coupling their right-hand sides by the operators (+), these equations can be combined into one equation.

Contraction Rule 4 can be combined into the following equations:

$$X=a.Y+\tau.Y$$

$$Y=b.Z$$

[Procedure 3] will be described below. As described above, in [Procedure 3], the (simultaneous) equations are solved. This procedure includes [Procedure 3-1] and [Procedure 3-2].

[Procedure 3-1]: An equation having T as a coefficient in its right-hand side is substituted in a state variable having T as a coefficient included in the right-hand side of an equation. For example, in the following equations:

$$X=a.Y+\tau.Y$$

$$Y=b.Z$$

since the second term (τ.Y) of the right-hand side of X=a.Y+τ.Y is a state variable having τ as a coefficient, (Y=b.Z) is substituted in the state variable Y in this second term. As a result, X=a.Y+τ.(b.Z) is obtained.

[Procedure 3-2]: Equations are simplified. Assume that τ is a transition label corresponding to an transition, and following rules (rule1, rule2) are approved as arithmetic operations between labels.

(rule1): x.τ=τ.x=x (x is an arbitrary label)

(rule2): After a substitution is made and the arithmetic operation for erasing τ based on rule1 is repeated, a term of the right-hand side in which a label associated with τ still remains is deleted.

As a result of the above processes for the term including τ in the above equation, we have:

$$X = a \cdot Y + \tau \cdot (b \cdot Z)$$
$$= a \cdot Y + (\tau \cdot b) \cdot Z$$
$$= a \cdot Y + b \cdot Z,$$

Finally, [Procedure 4] and [Procedure 5] will be described below. As described above, as a result of execution of [Procedure 1] to [Procedure 3] for the transition functions before contraction, the following equations corresponding to [Transition Functions Before Contraction] of <Contraction Rule 4>:

$$X = a.Y + b.Z$$

$$Y = b.Z$$

are obtained.

On the other hand, as a result of execution of [Procedure 1] to [Procedure 3] for the transition functions corresponding to [Transition Functions After Contraction] of <Contraction Rule 4>, the same equations as above can be obtained. Therefore, the rule verification unit 9 outputs a determination result indicating that <Contraction Rule 4> is valid (correct). Such output is presented to, e.g., the user who inputs contraction rules via the rule input unit 8.

(Timing Diagram Generation Unit 12)

Upon reception of the alternating automaton obtained from the property and a divided specification of the system, the timing diagram generation unit 12 generates timing diagrams, as will be described below. In this case, "divided specification" describes which signals serve as interface signals between two divided sub-systems when a target system is divided.

More specifically, the timing diagram generation unit 12 generates timing according to, e.g., the following procedures. In this case, assume that OUT={a, c, e} and IN={b, d, f} are given as an example of the divided specification where IN is a set of input signals, and OUT is a set of output signals. This corresponds to the input/output attribute information 13 shown in FIG. 1.

[Procedure 1] An automaton is contracted according to the divided specification.

[Procedure 2] Parts which match specific patterns in the automaton are searched for.

[Procedure 3] A sequence of patterns to be connected to each other is calculated.

[Procedure 4] The patterns are converted into a property.

[Procedure 5] The property is converted into timing diagrams.

Initially, in [Procedure 1], an automaton is contracted according to the divided specification. More specifically, an automaton is contracted using signals (IN∪OUT) included in the divided specification as contraction instruction information. That is, the input/output attribute information 1 is input to the timing diagram generation unit 12, and contraction instruction information based on the input/output attribute information 1 is supplied from the timing diagram generation unit 12 to the state transition machine contraction unit 6, thus issuing a contraction instruction of an automaton. In this embodiment, assume that an automaton after contraction, which is obtained by this processing, has the following structure.

Example of automaton after contraction (obtained by sorting transition functions)

$$\Sigma = \{q\_0, q\_1, q\_2, q\_3, q\_4, q\_5\}$$

$$q0 = q\_0$$

$$\delta(q\_0, a) = q\_0$$

$$\delta(q\_0, b) = q\_1$$

$$\delta(q\_1, \text{true}) = q\_2$$

$$\delta(q\_2, \text{true}) = q\_3$$

$$\delta(q\_3, c) = q\_4$$

$$\delta(q\_4, d) = q\_4$$

$$\delta(q\_4, e) = q\_5$$

$$\delta(q\_5, e) = q\_5$$

$$\delta(q\_5, f) = \text{true}$$

Next, in [Procedure 2], parts which match specific patterns in the automaton are searched for. That is, partial structures that match specific patterns in the automaton obtained by [Procedure 1] are obtained. The specific patterns are realized as the following transition function table.

For example, patterns corresponding to "x→y U z" are expressed like:

$$\delta(q\_\text{in}, x) = q1$$

$$\delta(q1, y) = q1$$

$$\delta(q1, z) = q\_\text{out}$$

Note that q_in indicates an input state from the outside of a pattern, and q_out indicates an output state to the outside of a pattern.

Likewise, patterns corresponding to, e.g., "x→F y" are expressed like:

$$\delta(q1, x) = q1,$$

$$\delta(q1, y) = q\_\text{out}$$

Likewise, patterns corresponding to, e.g., "x→X2y" are expressed like:

$$\delta(q\_\text{in}, x) = q1$$

$$\delta(q1, \text{true}) = q1$$

$$\delta(q2, \text{true}) = q3$$

$$\delta(q3, y) = q\_\text{out}$$

The sequence for searching for parts that match specific patterns in the automaton will be described in detail below.

Initially, when q0, q1, q_a, and b are respectively read as q_1, q_2, x, and y in the first two rows of the transition functions of the automaton:

$$\delta(q0, a) = q0$$

$$\delta(q0, b) = q1$$

since they match patterns of "x→F y":

$\delta(q\_1,x)=q\_1$ $\delta(q\_1,y)=q\_\text{out}$ x, y, and q__1 in these patterns are replaced to obtain the following partial term:

Partial term 1 = "a→F b"

$\delta(q\_0,a)=q\_0$ $\delta(q\_0,b)=q\_1$

When state variables and variable names are similarly replaced for the next four rows of the automaton after the last converted row:

$\delta(q\_0,b)=q\_1$ $\delta(q\_1,\text{true})=q\_2$ $\delta(q\_2,\text{true})=q\_3$ $\delta(q\_3,c)=q4$ they match patterns of "x→X2y":

$\delta(q\_\text{in},x)=q\_1$ $\delta(q1,\text{true})=q\_1$ $\delta(q2,\text{true})=q\_3$ $\delta(q\_3,y)=q\_\text{out}$ By replacing states and variables of these patterns, the following partial term is obtained:

Partial term 2 = "b→X2c"

$\delta(q\_0,b)=q\_1$ $\delta(q\_1,\text{true})=q\_1$ $\delta(q\_2,\text{true})=q\_3$ $\delta(q\_3,c)=q\_4$ Next, when state variables and variable names are similarly replaced for the next three rows of the automaton after the last converted row:

$\delta(q\_3,c)=q\_4$ $\delta(q\_4,d)=q\_4$ $\delta(q\_4,e)=q\_5$ they match patterns of "x→y U z":

$\delta(q\_\text{in},x)=q1$ $\delta(q1,y)=q1$ $\delta(q1,z)=q\_\text{out}$

By replacing states and variables of these patterns, the following partial term is obtained:

Partial term 3 = "c→d U e"

$\delta(q\_3,c)=q\_4$ $\delta(q\_4,d)=q\_4$ $\delta(q\_4,e)=q\_5$

Next, when state variables and variable names are similarly replaced for the next two rows of the automaton after the last converted row:

$\delta(q\_5,e)=q\_5$ $\delta(q\_5,f)=\text{true}$ they match patterns of "x→F y":

$\delta(q\_1,x)=q\_1$ $\delta(q\_1,y)=q\_\text{out}$

By replacing states and variables of these patterns, the following partial term is obtained:

Partial term 4 = "e→F f"

$\delta(q\_5,e)=q\_5$, $\delta(q\_5,f)=\text{true}$

With the aforementioned sequence, four partial terms that match the transition functions of the original automaton are obtained. The specific patterns correspond to temporal logic formulas, and the obtained partial structures are converted into a property later. FIG. 6 is a table showing examples of state transition patterns and corresponding logic formulas.

Next, in [Procedure 3], a sequence of patterns to be connected to each other is calculated. That is, a proximity relationship among the partial terms is decided with reference to the original entire structure (the automaton obtained as a result of contraction). The following four partial terms are obtained in the aforementioned example:

Partial term 1: a→Fb
Partial term 2: b→X2c
Partial term 3: c→d U e
Partial term 4: e→F f Furthermore, there is a proximity relationship via state variables: partial terms 1 and 2 are connected via a state variable=q__1, partial terms 2 and 3 are connected via state variables q__3 and q__4, and partial terms 3 and 4 are connected via a state variable=q__5. Such linkage of partial terms via state variables are called "scenario".

For example, the linkage obtained in this embodiment is called scenario 1. Scenario 1 is "partial term 1→(q__1)→partial term 2→(q__3, q__4)→partial term 3→(q__5)→partial term 4". In this embodiment, the series scenario via state variables is obtained. When there are a plurality of proximity partial terms via state variables (OR branches), scenarios can be obtained as many as the number of branches to be considered.

Next, in [Procedure 4], the patterns are converted into a property. The patterns correspond to timing diagrams. FIG. 7 shows timing diagrams corresponding to patterns. A timing diagram represents temporal changes of values with respect to variables and dependences approved between value changes between variables while the ordinate plots a variable type, and the abscissa plots a time axis delimited by unit times (cycles). The dependences include an order dependence (y takes place after x) and a temporal order relationship (y takes place after two cycles of x).

Figure 8:
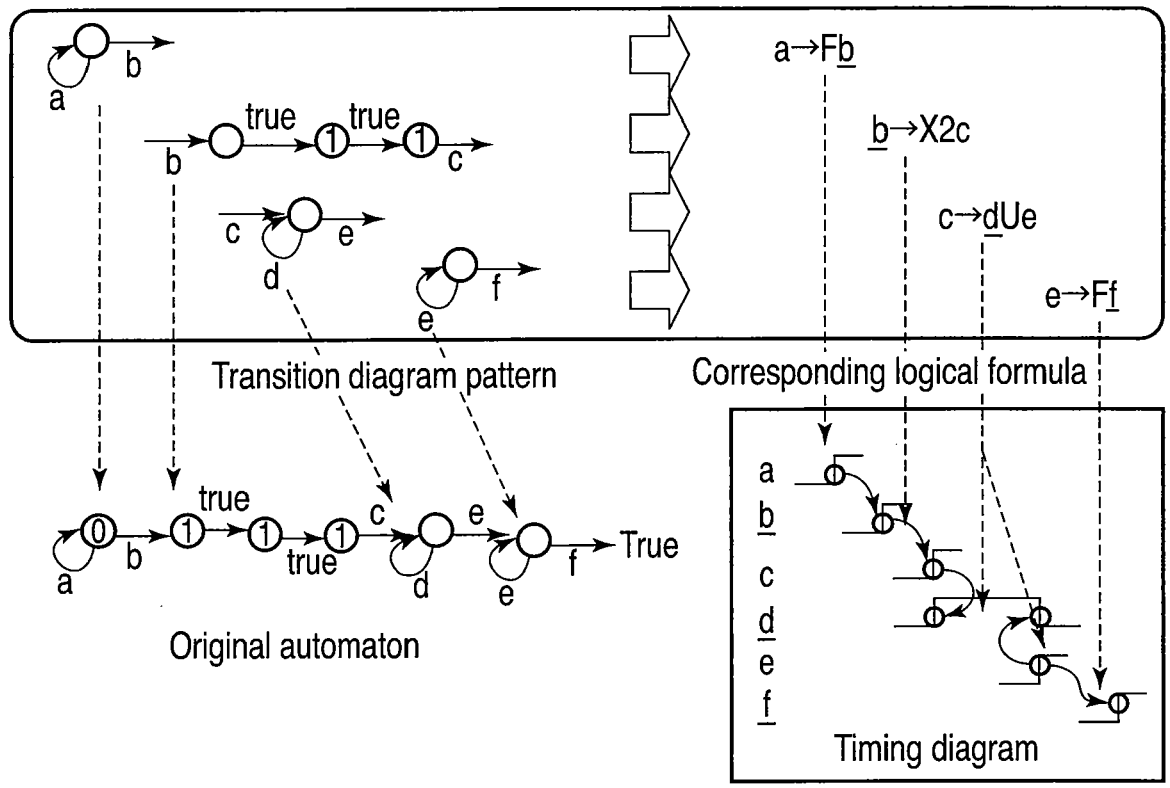
FIG. 8 is a view showing generation of timing diagrams.

Finally, in [Procedure 5], the property is converted into timing diagrams. FIG. 8 shows timing diagrams obtained by converting scenario 1 according to the correspondence shown in FIG. 7. Each timing diagram serves as a property for an external environment in the divided partial structure. Especially, a property having a pattern "input variable→output variable" is called "Guarantee property", and that having a pattern "output variable→input variable" is called "Assume property".

When a system is divided into, for example, software and hardware, timing diagrams specify interface specifications, and Assume in one (example: hardware (HW)) serves as Guarantee in the other (example: software (SW)). Likewise, Guarantee corresponds to Assume. Sorting the properties into Assume and Guarantee reveals preconditions (Assume) upon execution of format verification such as model verification and properties (Guarantee) to be secured. As described above, easy facing up of properties between software and hardware via timing diagrams can be effectively attained.

Using the aforementioned embodiment, when properties associated with restrictions of a design target are expressed by logic variables which represent signal values and logic formulas or temporal logic formulas including the logic variables as atomic terms, a partial restriction associated with only an arbitrary logic variable across a plurality of properties can be selected from a given set of properties, and a new property obtained by expressing the partial restriction by a logic formula or temporal logic formula can be extracted. That is, when an effective arbitrary part is narrowed down from an overall set of assertions and is used in verification, efficient verification can be attained. In a system as a combination of hardware (HW) and software (SW), related restrictions of hardware and software can be obtained as timing diagrams. Therefore, facing up between hardware and software can be efficiently attained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A property extraction apparatus comprising:
a state transition machine conversion unit which converts an input property into a state transition machine configured by a plurality of transition functions expressed using a plurality of transition labels;
a storage unit which stores contraction rules that allow to remove a non-input transition;
a state transition machine contraction unit which contracts the state transition machine by converting a transition label corresponding to a signal to be ignored into a non-input transition in the state transition machine in accordance with contraction instruction information which represents the signal to be ignored, and rewriting the transition functions by applying the contraction rules that allow to remove the non-input transition; and
a property conversion unit which converts the state transition machine after the contraction processing into an output property.

2. The apparatus according to claim 1, further comprising:
a contraction rule input unit which inputs a new contraction rule and adds the new contraction rule to the storage unit; and
a rule verification unit which verifies validities of the contraction rules stored in the storage unit.

3. The apparatus according to claim 2, wherein the rule verification unit determines whether or not the contraction rules are valid by modifying the transition functions included in the state transition machine before the contraction using the contraction rules by the state transition machine contraction unit into first equations, modifying transition functions included in the state transition machine after the contraction using the contraction rules by the state transition machine contraction unit into second equations, and determining whether or not the first equations are allowed to be modified to the second equations.

4. The apparatus according to claim 1, further comprising a timing diagram generation unit which extracts properties that match specific patterns from a state transition machine obtained by the contraction executed using input/output attribute information of a signal of interest as the contraction instruction information, and generates timing diagrams from the set of properties.

5. A property extraction method comprising:
converting, by a state transition machine conversion unit, an input property into a state transition machine configured by a plurality of transition functions expressed using a plurality of transition labels;
storing, by a storage unit, contraction rules that allow to remove a non-input transition;
contracting, by a state transition machine contraction unit, the state transition machine, the contracting including:
converting a transition label corresponding to a signal to be ignored into a non-input transition in the state transition machine in accordance with contraction instruction information which represents the signal to be ignored, and
rewriting the transition functions by applying the contraction rules that allow to remove the non-input transition; and
converting, by a property conversion unit, the state transition machine after the contraction processing into an output property.

6. The method according to claim 5, further comprising:
inputting, by a contraction rule input unit, a new contraction rule;
adding the new contraction rule to the storage unit; and
verifying, by a rule verification unit, validities of the contraction rules stored in the storage unit.

7. The method according to claim 6, wherein the rule verification unit determines whether or not the contraction rules are valid by:
modifying the transition functions included in the state transition machine before the contraction using the contraction rules by the state transition machine contraction unit into first equations;
modifying transition functions included in the state transition machine after the contraction using the contraction rules by the state transition machine contraction unit into second equations; and
determining whether or not the first equations are allowed to be modified to the second equations.

8. The method according to claim 5, further comprising extracting, by a timing diagram generation unit, properties that match specific patterns from a state transition machine obtained by the contraction executed using input/output attribute information of a signal of interest as the contraction instruction information, and to generate timing diagrams from the set of properties.

* * * * *